United States Patent
Yang et al.

(10) Patent No.: US 10,665,646 B2
(45) Date of Patent: May 26, 2020

(54) SPLICING SCREEN, DISPLAY DEVICE AND MOBILE TERMINAL

(71) Applicant: GUANGDONG OPPO MOBILE TELECOMMUNICATIONS CORP., LTD., Dongguan, Guangdong (CN)

(72) Inventors: Le Yang, Guangdong (CN); Haiping Zhang, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 4 days.

(21) Appl. No.: 15/934,280

(22) Filed: Mar. 23, 2018

(65) Prior Publication Data

US 2018/0331163 A1 Nov. 15, 2018

(30) Foreign Application Priority Data

May 12, 2017 (CN) .......................... 2017 1 0342858

(51) Int. Cl.
| | |
|---|---|
| *H01L 27/32* | (2006.01) |
| *G06F 1/16* | (2006.01) |
| *G06K 9/00* | (2006.01) |
| *G09F 21/10* | (2006.01) |

(Continued)

(52) U.S. Cl.
CPC ........ *H01L 27/3244* (2013.01); *G06F 1/1652* (2013.01); *G06F 3/0412* (2013.01); *G06K 9/0004* (2013.01); *G06K 9/00013* (2013.01); *G09F 21/10* (2013.01); *H01L 23/4985* (2013.01)

(58) Field of Classification Search
CPC . G06F 1/1652; G06F 3/0412; G06K 9/00013; G06K 9/0004; G09F 21/10; H01L 23/4985; H01L 27/3244
See application file for complete search history.

(56) References Cited

U.S. PATENT DOCUMENTS

2012/0242635 A1* 9/2012 Erhart .................. G06F 1/1626
345/207
2014/0354596 A1* 12/2014 Djordjev ............. G06K 9/0002
345/175

(Continued)

FOREIGN PATENT DOCUMENTS

| CN | 201017568 Y | 2/2008 |
|---|---|---|
| CN | 201417577 Y | 3/2010 |

(Continued)

OTHER PUBLICATIONS

European Patent Application No. 18159912.7 extended Search and Opinion dated Oct. 17, 2018, 8 pages.

(Continued)

*Primary Examiner* — Viet D Pham
(74) *Attorney, Agent, or Firm* — Lathrop GPM LLP

(57) ABSTRACT

A splicing screen is provided, and includes a flexible screen, an LED screen and a flexible circuit board. The flexible screen has an opening running through the flexible screen, and the LED screen is arranged in the opening. A signal line in the LED screen is bonded to the flexible circuit board, and a signal line in the flexible circuit board is bonded to the flexible screen. The present disclosure further provides a display device and a mobile terminal.

18 Claims, 3 Drawing Sheets

(51) Int. Cl.
*G06F 3/041* (2006.01)
*H01L 23/498* (2006.01)

(56) References Cited

U.S. PATENT DOCUMENTS

| | | | |
|---|---|---|---|
| 2016/0041663 A1* | 2/2016 | Chen | G06F 3/0412 345/174 |
| 2016/0181572 A1 | 6/2016 | Prushinskiy et al. | |
| 2017/0124372 A1 | 5/2017 | Evans et al. | |
| 2017/0160819 A1* | 6/2017 | Yi | G06F 3/0416 |
| 2017/0220840 A1* | 8/2017 | Wickboldt | G06K 9/0053 |
| 2017/0220844 A1* | 8/2017 | Jones | G06K 9/0053 |
| 2017/0279948 A1* | 9/2017 | Hong | G06K 9/00013 |
| 2017/0289805 A1* | 10/2017 | Hong | G09G 3/3233 |
| 2018/0190710 A1* | 7/2018 | Ryu | H01L 27/14678 |

FOREIGN PATENT DOCUMENTS

| | | |
|---|---|---|
| CN | 202332124 U | 7/2012 |
| CN | 202487090 U | 10/2012 |
| CN | 202855256 U | 4/2013 |
| CN | 103416043 A | 11/2013 |
| CN | 104035626 A | 9/2014 |
| CN | 104063697 A | 9/2014 |
| CN | 104598186 A | 5/2015 |
| CN | 104751130 A | 7/2015 |
| CN | 106450027 A | 2/2017 |
| CN | 205983304 U | 2/2017 |
| CN | 106657459 A | 5/2017 |
| CN | 107180599 A | 9/2017 |
| CN | 206557671 U | 10/2017 |
| EP | 3054399 A1 | 8/2016 |
| JP | 2010252356 A | 11/2010 |
| KR | 20120135112 A | 12/2012 |
| WO | WO 2014192236 A1 | 12/2014 |
| WO | WO 2018086493 A1 | 5/2018 |

OTHER PUBLICATIONS

Taiwan Patent Application No. 107102368 Office Action dated Sep. 14, 2018, 4 pages.
Chinese Patent Application No. 201710342858.X, English translation of Office Action dated Nov. 28, 2018, 6 pages.
Chinese Patent Application No. 201710342858.X, Office Action dated Nov. 28, 2018, 7 pages.
PCT/CN2018/077439 Engish Translation of the International Search Report and Written Opinion dated Jun. 1, 2018, 13 pp.
Indian Patent Application No. 201834007597, Office Action dated Mar. 20, 2020, 5 pages.

* cited by examiner

SPLICING SCREEN, DISPLAY DEVICE AND MOBILE TERMINAL

CROSS-REFERENCE TO RELATED APPLICATION

This application claims priority to and benefits of Chinese Patent Application No. 201710342858.X, filed with State Intellectual Property Office on May 12, 2017, the entire content of which is incorporated herein by reference.

FIELD

The present disclosure relates to a technical field of electronic equipment, and more particularly to a splicing screen, a display device and a mobile terminal.

BACKGROUND

A flexible screen is obviously superior to a screen, not only in lighter and thinner dimension, but also in lower consumption than an original component, which is conductive to improving endurance of a device. Meanwhile, the flexible screen has much higher durability than previous screens due to its characteristics of bendability and good flexibility, and the probability of accidental damage to the device is reduced.

SUMMARY

The present disclosure provides a splicing screen, including: a flexible screen, an LED screen and a flexible circuit board. The flexible screen has an opening running through the flexible screen, and the LED screen is arranged in the opening. A signal line in the LED screen is bonded to the flexible circuit board, and a signal line in the flexible circuit board is bonded to the flexible screen.

The present disclosure further provides a display device. The display device includes a fingerprint identification module and a splicing screen. The splicing screen includes an organic light-emitting diode screen having an opening running through the organic light-emitting diode screen; a light emitting diode screen provided in the opening; a flexible circuit board, a signal line in the light emitting diode screen being bonded to a flexible circuit board, and a signal line in the flexible circuit board being bonded to the organic light-emitting diode screen. The fingerprint identification module is provided on the light emitting diode screen.

The present disclosure further provides a mobile terminal. The mobile terminal includes a display device including a fingerprint identification module and a splicing screen. The splicing screen includes: a flexible screen having an opening running through the flexible screen; an LED screen provided in the opening; a flexible circuit board capable of transferring signal, and a signal line of the LED screen being bonded to the flexible screen through relay of the signal line of the LED screen. The fingerprint identification module is provided on the LED screen.

BRIEF DESCRIPTION OF THE DRAWINGS

To describe technical solutions in embodiments of the present disclosure more clearly, the following will briefly introduce the accompanying drawings required for the description of the embodiments. Obviously, the accompanying drawings described below only show some embodiments of the present disclosure, and those skilled in the art can obtain other drawings based on these drawings without paying creative efforts.

DETAILED DESCRIPTION

Figure 1:
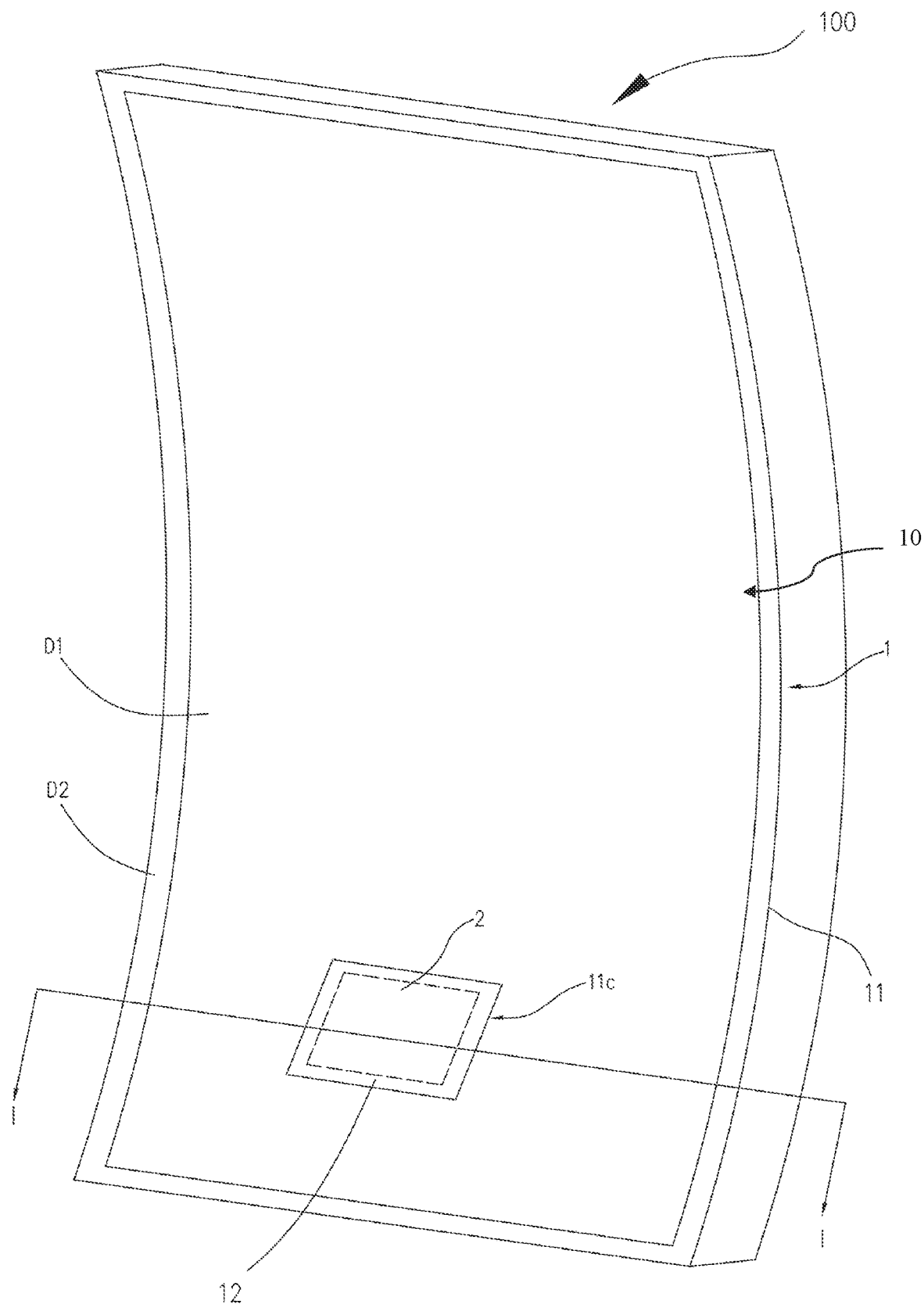
FIG. 1 is a schematic view of a mobile terminal according to embodiments of the present disclosure.

Technical solutions in embodiments of the present disclosure will be described clearly and completely in combination with reference to the accompanying drawings in the embodiments of the present disclosure.

In the specification, unless specified or limited otherwise, relative terms such as "central", "longitudinal", "lateral", "front", "rear", "right", "left", "inner", "outer", "lower", "upper", "horizontal", "vertical", "above", "below", "up", "top", "bottom" as well as derivative thereof (e.g., "horizontally", "downwardly", "upwardly", etc.) should be construed to refer to the orientation as then described or as shown in the drawings under discussion. These relative terms are for convenience of description and do not require that the present disclosure be constructed or operated in a particular orientation.

In the present invention, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present invention, the term "a plurality of" means two or more than two, unless specified otherwise.

In an embodiment, a splicing screen is provided. The splicing screen includes a flexible screen having an opening running through the flexible screen; an LED screen provided in the opening; a flexible circuit board, a signal line in the LED screen being bonded to a flexible circuit board, and a signal line in the flexible circuit board being bonded to the flexible screen.

FIG. 1 illustrates a mobile terminal 100 according to an embodiment of the present disclosure. The mobile terminal 100 may be any device that has communication and storage functions, such as a tablet computer, a mobile phone, an e-reader, a remote controller, a personal computer (PC), a notebook computer, a vehicle-mounted device, a network television, a wearable device, and other network-enabled smart devices. The mobile terminal 100 has a display device 10, and the display device 10 is mainly used to display image and perform touch operation from a user.

Figure 2:
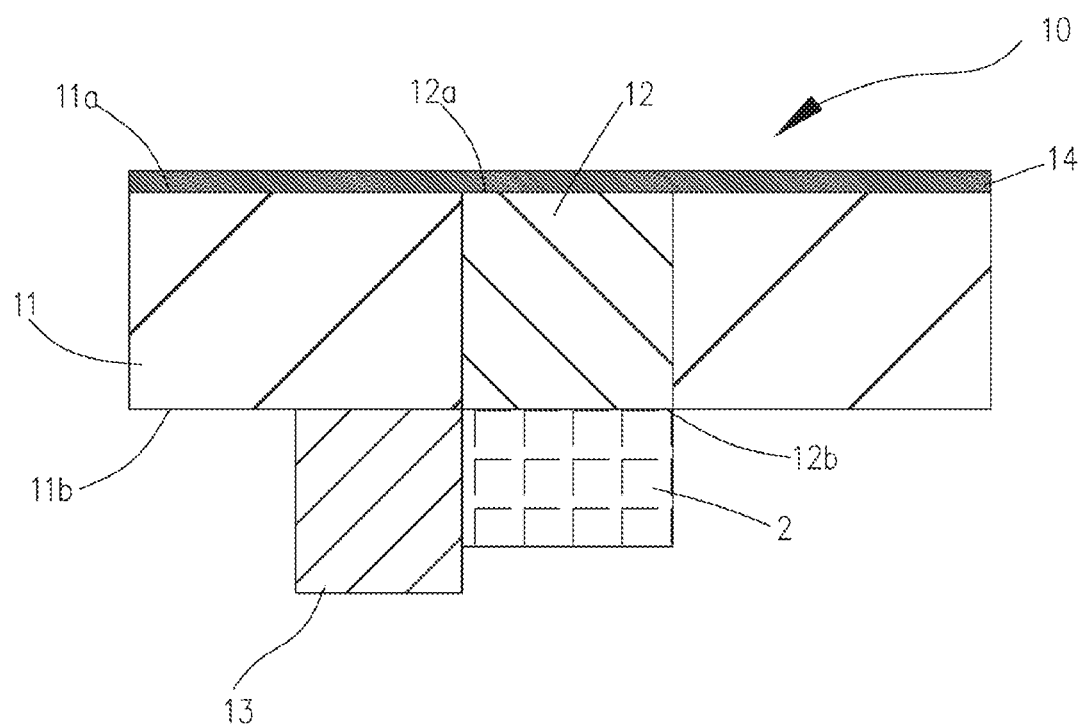
FIG. 2 is a sectional view of a display device in the mobile terminal illustrated in FIG. 1, which is taken along line I-I.

Referring to FIGS. 1 and 2, the display device 10 includes a fingerprint identification module 2 and a splicing screen 1. By providing the splicing screen 1 with the fingerprint identification module 2, the mobile terminal 100 can be operated by means of the fingerprint identification module 2, for example, unlocking the mobile terminal 100. The splicing screen 1 includes a flexible screen 11 and a hard screen 12, the flexible screen 11 has an opening 11c running through the flexible screen 11, and the hard screen 12 is arranged in the opening 11c. A signal line in the hard screen 12 is bonded to a flexible circuit board 13, and a signal line in the flexible circuit board 13 is bonded to the flexible screen 11, so as to achieve electrical coupling between the hard screen 12 and the flexible screen 11. The flexible circuit board 13 is arranged below the flexible screen 11. It should be understand by those skilled in the art, the flexible circuit board 13 can be arranged at any needed position, as long as the hard screen 12 is electrically coupled with the flexible screen 11. The fingerprint identification module 2 is arranged on the hard screen 12, whereby the display device 10 has a fingerprint identification function.

The splicing screen 1 is bendable, and the position of the hard screen 12 enhances rigidity of the splicing screen 1 to a certain extent, such that it is convenient to apply the splicing screen 1 to various devices and mount various components (like the fingerprint identification module) to the splicing screen, thereby improving the reliability of the splicing screen 1. The display device 10 and the mobile terminal 100 adopt the above splicing screen 1, and since the splicing screen 1 is provided with the hard screen 12, the fingerprint identification module can be mounted to the hard screen 12 well, improving the reliability of the display device 10 and the mobile terminal 100.

It could be understood that, referring to FIG. 2, the flexible screen 11 is an organic light-emitting diode (OLED) screen. The flexible screen 11 has a first front surface 11a and a first rear surface 11b arranged opposite to each other; the first front surface 11a is a surface that faces the user and can perform touch and display operations, while the first rear surface 11b is generally located in an interior of the mobile terminal 100. The first front surface 11a has a display area D1 and a non-display area D2 connected integrally, and the display area D1 is used for image display and touch.

It could be understood that the opening 11c is processed out of the flexible screen 11 by laser cutting. Certainly, in other embodiments, the opening 11c can be processed out of the flexible screen 11 in other manners, for example, through a numerically-controlled machine tool.

The hard screen 12 is a light-emitting diode (LED) screen. The hard screen 12 has a second front surface 12a and a second rear surface 12b arranged opposite to each other; the second front surface 12a is a surface that faces the user and can perform touch and display operations, while the second rear surface 12b is generally located in the interior of the mobile terminal 100. The hard screen 12 is substantially consistent with the opening 11c in terms of size and shape, so the hard screen 12 can be provided in the opening 11c well to ensure the integrity of the splicing screen 1.

Specifically, the flexible screen 11 is electrically coupled with the hard screen 12 in such a way that the signal line in the hard screen 12, i.e. a thin film transistor (TFT) circuit in the hard screen 12, is hot-pressed to the flexible circuit board 13 through a FOG (Flex On Glass FPC) technology, and the signal line is hot-pressed by the flexible circuit board 13 to a TFT circuit of the flexible screen 11 through the FOG technology, such that the hard screen 12 is electrically coupled with the flexible screen 11. The flexible circuit board 13 plays a role of signal transfer, and the signal line in the hard screen 12 is bonded to the flexible screen 11 through the relay of the signal line in the hard screen 12, so as to achieve the electrical coupling between the hard screen 12 and the flexible screen 11. After the flexible circuit board 13 is re-coupled to a motherboard of the mobile terminal 100, the motherboard can control the display of the flexible screen 11 and the hard screen 12.

The first front surface 11a of the flexible screen 11 and the second front surface 12a of the hard screen 12 are flush and spliced into a first surface of the splicing screen 1. The first rear surface 11b of the flexible screen 11 and the second rear surface 12b of the hard screen 12 are spliced into a second surface of the splicing screen 1.

It could be understood that a size of the flexible screen 11 is much larger than a size of the hard screen 12, i.e. the splicing screen 1 is mainly composed of the flexible screen 11, so as to ensure relatively small thickness and good bendability of the splicing screen 1.

It could be understood that the flexible screen 11 has the display area D1 for image display, and the opening 11c is located in the display area D1. By providing the opening 11c in the display area D1 of the display screen, the strength of the position where the opening 11c is provided in the display area D1 is enhanced. Certainly, in other embodiments, the flexible screen 11 can be located in the non-display area D2 of the flexible screen 11.

It could be understood that, referring to FIG. 2, the splicing screen 1 further includes a glass cover plate 14, and the glass cover plate 14 is arranged on a surface of the splicing screen 1 that displays images. Specifically, the splicing screen 1 is bent into a required shape, the glass cover plate 14 is arranged on the first surface of the entire splicing screen 1 through an OCA (Optically Clear Adhesive), the splicing screen 1 can has a definite shape due to the rigidity of the glass cover plate 14, and the entire glass cover plate 14 can ensure simplified installation of the splicing screen 1.

Further, referring to FIG. 2, the hard screen 12 has a non-display surface, and the fingerprint identification module 2 is hot-pressed on the non-display surface. Specifically, the non-display surface of the hard screen 12 is the second rear surface 12b of the hard screen 12. The hard screen 12 has certain strength, so the fact that the fingerprint identification module 2 is hot-pressed on the second rear surface 12b of the hard screen 12 will not cause damage to the hard screen 12, thereby improving the reliability of the splicing screen 1. Moreover, the hard screen 12 is provided in the opening 11c, the opening 11c is located in the display area D1 of the flexible screen 11, and the fingerprint identification module 2 is hot-pressed on the second rear surface 12b of the hard screen 12, that is, the fingerprint identification module 2 is accommodated within the display device 10, so the hard screen 12 cannot only perform fingerprint identification, but also perform display, so as to increase a screen-to-body ratio of the mobile terminal 100.

It could be understood that the size of the hard screen 12 is the same as that of the fingerprint identification module 2, so as to further reduce the proportion of the hard screen 12 in the splicing screen 1 and ensure good bendability of the splicing screen 1.

It could be understood that the fingerprint identification module 2 is an optical fingerprint identification component. Certainly, in other embodiments, the fingerprint identification module 2 can be an infrared fingerprint identification component.

During manufacturing of the mobile terminal 100, the hard screen 12 is first provided in the opening 11c of the flexible screen 11, and then the fingerprint identification module 2 is hot-pressed to the second rear surface 12b of the hard screen 12, so that the fingerprint identification module 2 is accommodated in the mobile terminal 100. The user can perform a fingerprint identification operation by pressing the hard screen 12, and the hard screen 12 can display together with the flexible screen 11 when no fingerprint identification operation is performed.

For the splicing screen 1 according to the present disclosure, by providing the hard screen 12 in the opening 11c of the flexible screen 11, and splicing the flexible screen 11 and the hard screen 12 into the splicing screen 1, this splicing screen 1 is bendable, and the position of the hard screen 12 enhances the rigidity of the splicing screen 1 to a certain extent, such that it is convenient to apply the splicing screen 1 to various devices and mount various components (like the fingerprint identification module) to the splicing screen, thereby improving the reliability of the splicing screen 1.

Figure 3:
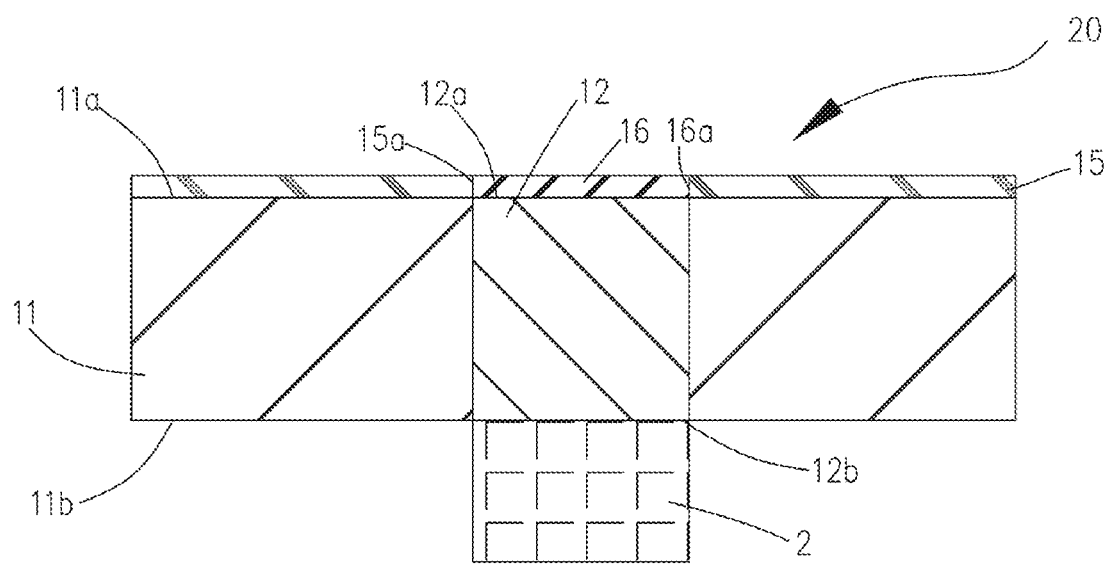
FIG. 3 is a schematic view of a display device.

FIG. 3 illustrates another display device 20. The splicing screen 1 further includes a first cover plate 15 and a second cover plate 16. The first cover plate 15 is arranged on a surface of the flexible screen 11 that displays images, i.e. the first front surface 11a. The second cover plate 16 is arranged on a surface of the hard screen 12 that displays images, i.e. the second front surface 12a, and a side wall 16a of the second cover plate 16 adheres to a side wall 15a of the first cover plate 15. Specifically, the first cover plate 15 is a flexibly bendable plastic cover plate, while the second cover plate 16 is a glass cover plate. The flexibly bendable plastic cover plate ensures that the splicing screen 1 can have good bendability.

Figure 4:
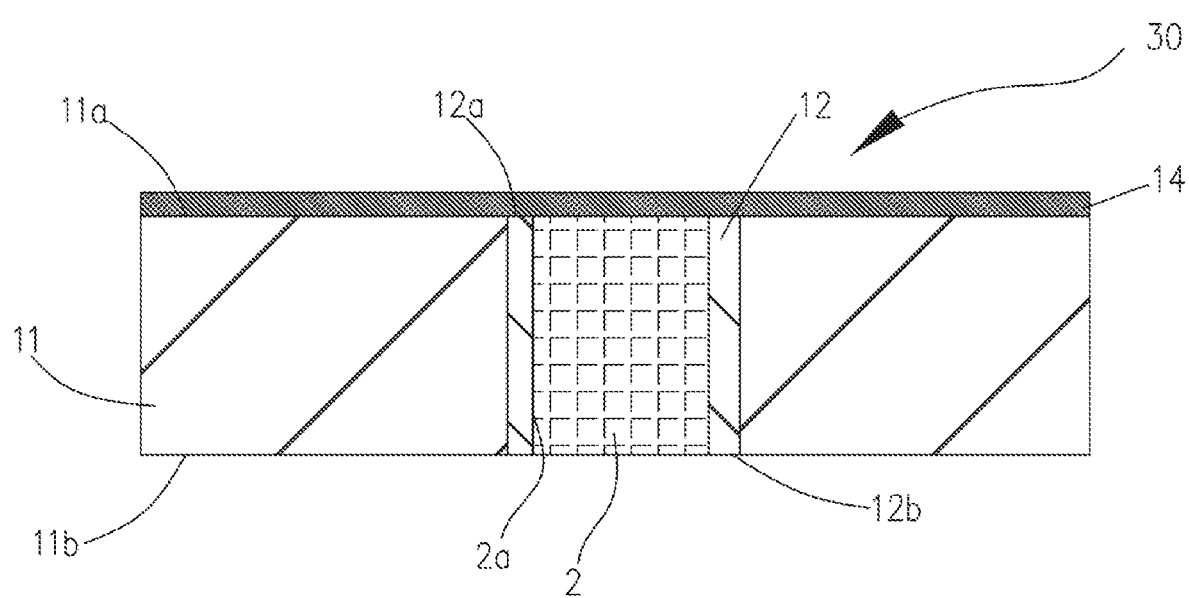
FIG. 4 is a schematic view of another display device.

FIG. 4 illustrates still another display device 30. According to the display device 30, the hard screen 12 can define a hollow accommodating groove 2a, that is, the size of the accommodating groove 2a is smaller than that of the hard screen 12, and hence the fingerprint identification module 2 is accommodated in the accommodating groove 2a. The part of the hard screen 12 outside the accommodating groove 2a can provide certain rigidity for the fingerprint identification module 2 when the splicing screen 1 is bent, to prevent the fingerprint identification module 2 from being bent here, which affects the accuracy of the fingerprint identification module 2. It could be understood that the accommodating groove 2a is not in communication to the glass cover plate 14 above the second front surface 12a.

The display device 10, 20, 30 and the mobile terminal 100 according to the present disclosure adopt the above splicing screen 1, and since the splicing screen 1 is provided with the hard screen 12, the fingerprint identification module can be attached to the hard screen 12 well, improving the reliability of the display device 10 and the mobile terminal 100.

The above are preferred embodiments of the present disclosure, and it should be noted that those skilled in the art can make various improvements and modifications without departing from the principle of the present disclosure, and these improvements and modifications are also regarded as the protection scope of the present disclosure.

What is claimed is:

1. A splicing screen, comprising:
a flexible screen having a first front surface and a first rear surface arranged opposite to each other, and an opening defined in a display area and running through the first front surface and the first rear surface;
a hard screen provided in the opening and having a second front surface and a second rear surface arranged opposite to each other, the first front surface and the second front surface being flush and spliced into a first surface of the splicing screen, and the first rear surface and the second rear surface being spliced into a second surface of the splicing screen; and
a flexible circuit board, a signal line in the hard screen being bonded to the flexible circuit board, and a signal line in the flexible circuit board being bonded to the flexible screen.

2. The splicing screen according to claim 1, further comprising a glass cover plate on a surface of the splicing screen for displaying image.

3. The splicing screen according to claim 1, further comprising:
a first cover plate on a surface of the flexible screen for displaying image; and
a second cover plate on a surface of the hard screen for displaying image, a side wall of the first cover plate adhering to a side wall of the second cover plate.

4. The splicing screen according to claim 3, wherein the first cover plate is a flexibly bendable plastic cover plate, and the second cover plate is a glass cover plate.

5. The splicing screen according to claim 1, wherein the flexible screen further has a non-display area connected with the display area integrally.

6. The splicing screen according to claim 1, wherein the flexible screen is an organic light-emitting diode screen.

7. The splicing screen according to claim 1, wherein the signal line in the hard screen is a thin film transistor circuit, and the signal line in the flexible circuit board is another thin film transistor circuit.

8. A display device, comprising a fingerprint identification module and a splicing screen, the splicing screen comprising:
a flexible screen having a first front surface and a first rear surface arranged opposite to each other, and an opening defined in a display area and running through the first front surface and the first rear surface;
a hard screen provided in the opening and having a second front surface and a second rear surface arranged opposite to each other, the first front surface and the second front surface being flush and spliced into a first surface of the splicing screen, and the first rear surface and the second rear surface being spliced into a second surface of the splicing screen; and
a flexible circuit board, a signal line in the hard screen being bonded to a flexible circuit board, and a signal line in the flexible circuit board being bonded to the flexible screen.

9. The display device according to claim 8, wherein the fingerprint identification module is an optical fingerprint identification component; or the fingerprint identification module is an infrared fingerprint identification component.

10. The display device according to claim 8, wherein the hard screen defines a hollow accommodating groove, size of the accommodating groove is smaller than that of the hard screen, and the fingerprint identification module is accommodated in the accommodating groove.

11. The display device according to claim 10, further comprising a glass cover plate superposed on a surface of the splicing screen for displaying image.

12. The display device according to claim 11, wherein the accommodating groove is not in communication to the glass cover plate.

13. The display device according to claim 11, wherein the glass cover plate is superposed on the surface of the entire splicing screen through an optically clear adhesive.

14. The display device according to claim 8, wherein size of the hard screen is the same as that of the fingerprint identification module.

15. The display device according to claim 8, wherein the fingerprint identification module is hot-pressed on the second rear surface of the hard screen provided in the opening.

16. A mobile terminal, comprising a display device comprising a fingerprint identification module and a splicing screen, the splicing screen comprising:
- a flexible screen having a first front surface and a first rear surface arranged opposite to each other, and an opening defined in a display area and running through the first front surface and the first rear surface;
- a hard LED screen provided in the opening and having a second front surface and a second rear surface arranged opposite to each other, the first front surface and the second front surface being flush and spliced into a first surface of the splicing screen, and the first rear surface and the second rear surface being spliced into a second surface of the splicing screen; and
- a flexible circuit board capable of transferring signal, and a signal line in the hard LED screen being bonded to the flexible screen through relay of the signal line in the hard LED screen, the fingerprint identification module being provided on the hard LED screen.

17. The mobile terminal according to claim 16, wherein the second front surface faces a user and can perform touch and display operations, while the second rear surface is located in the interior of the mobile terminal.

18. The mobile terminal according to claim 17, wherein the fingerprint identification module is hot-pressed on the second rear surface of the hard LED screen.

* * * * *